(12) United States Patent
Lee

(10) Patent No.: US 7,006,197 B2
(45) Date of Patent: Feb. 28, 2006

(54) OPTICAL PROJECTION SYSTEM

(75) Inventor: Duk Lee, Tokyo (JP)

(73) Assignee: Orc Manufacturing Co., Ltd., Tokyo (JP)

( * ) Notice: Subject to any disclaimer, the term of this patent is extended or adjusted under 35 U.S.C. 154(b) by 37 days.

(21) Appl. No.: 10/854,673

(22) Filed: May 27, 2004

(65) Prior Publication Data

US 2004/0240210 A1 Dec. 2, 2004

(30) Foreign Application Priority Data

May 30, 2003 (JP) .............................. 2003-155292

(51) Int. Cl.
*G03B 27/54* (2006.01)
*G03B 27/42* (2006.01)

(52) U.S. Cl. .......................................... 355/67; 355/53
(58) Field of Classification Search ................. 355/53, 355/55, 67–71; 250/548; 359/364–365, 359/730

See application file for complete search history.

(56) References Cited

U.S. PATENT DOCUMENTS 5,159,172 A * 10/1992 Goodman et al. ..... 219/121.68
5,557,469 A 9/1996 Markle et al.
5,559,629 A * 9/1996 Sheets et al. ............... 359/364
5,781,346 A 7/1998 Allen et al.
6,717,746 B1 * 4/2004 Epple et al. ................ 359/727

FOREIGN PATENT DOCUMENTS

JP 10509561 T 9/1995
JP A-8-179217 7/1996

\* cited by examiner

*Primary Examiner*—Henry Hung Nguyen
(74) *Attorney, Agent, or Firm*—Berenato, White & Stavish

(57) ABSTRACT

An optical projection system irradiating a projection light on a work. This optical projection system includes a reflector provided with a first reflection surface and a second reflection surface which reflect the projection light and change a traveling direction of the projection light, an entrance lens which guides the projection light to the first reflection surface, a reflective optics which reflects the projection light reflected by the first reflection surface and guides the projection light to the second reflection surface, an exit lens which guides the projection light reflected by the second reflection to the work, and a position adjustor which supports coaxially the entrance lens and the exit lens so that the entrance lens is spaced a predetermined distance from the exit lens, and the reflector is positioned therebetween.

16 Claims, 7 Drawing Sheets

OPTICAL PROJECTION SYSTEM

BACKGROUND OF THE INVENTION

1. Field of the Invention

The present invention relates to an optical projection system to be used for an exposure of a selected pattern on a work by irradiating a projection light obtained by passing an illumination light through a mask.

2. Description of Relevant Art

An apparatus to be used for providing patterns of an electronic circuit of a circuit board, a liquid crystal panel, and a LCD color filter has been widely spread. As an example of these kinds of apparatus, a lithography apparatus that performs the exposure by irradiating ultraviolet light of predetermined wave length can be cited.

Various kinds of optical projection system or catadioptric optical system to be adopted in a lithography apparatus have been brought to market.

A catadioptric optical system 50 disclosed in Japanese Patent publication H10-509561 is one example of the optical projection system of the lithography apparatus.

This catadioptric optical system 50, as shown in FIG. 6, includes a reticle (mask) 51, plates 52 and 58, prisms 53 and 57, a plano-convex lens 54, a meniscus lens 55, and a reflection mirror 56.

In this catadioptric optical system 50, the plate 52 is positioned between the reticle (mask) 51 and the prism 53, and the plate 58 is similarly positioned between a work 59 and the prism 57.

Each of plates 52 and 58 are allowed to bend in lengthwise and crosswise direction. Therefore, the magnification of an image (pattern) to be focused on the work 59 that is formed by a projection light passed through respective plates 52 and 58 can be controlled by changing the curvature of respective plates 52 and 58.

Referring to FIG. 6, the illumination light passed through the mask 51 having a selected pattern thereon passes through the plate 52, and is then directed to the plano-convex lens 54 by the prism 53. The illumination light reflected by the prism 53 passes through the plano-convex lens 54 and the meniscus lens 55, and then strikes the reflection mirror 56. When the illumination light strikes the reflection mirror 56, the illumination light is reversed and is directed to the prism 57. Then, the illumination light reflected by the reflection mirror 56 passes through the meniscus lens 55 and the plano-convex lens 54, and is irradiated on the work 59 after reflected by the reflection mirror 56.

Thereby, the image of the selected pattern on the mask 51 is focused on the work 59. In this occasion, since a magnification of the pattern to be focused on the mask 51 can be varied in compliance with the curvature of the plate 52, the apparatus adopting this catadioptric optical system 50 is allowed to handle various kinds of works differing in size.

A catadioptric optical system 60 disclosed in Japanese unexamined patent publication H8-179217 is the other example of an optical projection system or catadioptric optical system to be adopted in a lithography apparatus.

The catadioptric optical system 60, as shown in FIG. 7A and FIG. 7B, includes a roof prism 61, a right-angle prism 62, a plano-convex lens 63, a concavo-convex lens 64, a meniscus lens 65, a reflection mirror 66, and a magnification compensator 70.

Referring to FIG. 7A, the illumination light irradiated from a light source is directed to the reflection mirror 66 by the roof prism 61, and strikes the reflection mirror 66 after passing through the plano-convex lens 63, the concavo-convex lens 64 adjoined to this plano-convex lens 63, and the meniscus lens 65. When the illumination light strikes the reflection mirror 66, the illumination light is reversed and is directed to the right-angle prism 62. The illumination light reflected by the reflection mirror 66 passes through the meniscus lens 65, the concavo-convex lens 64, and the plano-convex lens 63, and then strikes the right-angle prism 62. Thus, the illumination light reflected by the right-angle prism 62 is irradiated on the work via the magnification compensator 70.

The magnification compensator 70 of the catadioptric optical system 60 includes a plano-concave lens 71, a plano-convex lens 72, and an actuator 73. In this magnification compensator 70, the plano-convex lens 72 is spaced a predetermined distance from the plano-concave lens 71, and this distance is adjusted by the actuator 73.

In case of catadioptric optical system 50, the magnification of the image of the selected pattern to be focused on the work is adjusted by bending mechanically respective plates 52 and 58. Thus, a fatigue of plates 52 and 58 may be caused due to a bending stress. If such fatigue arises, the accurate adjustment of the magnification of the image may be disturbed.

In case of catadioptric optical system 60, the magnification of the image or the selected pattern to be focused on the work is adjusted by changing the distance between the plano-concave lens 71 and the plano-convex lens 72. Thus, the control of the occurrence of the distortion may be difficult.

In the conventional reflection compensation system, since the cemented lens is adopted, this cemented lens has an advantage with regard to the chromatic aberrations. But if ultraviolet lay is adopted as the illumination light (projection light), the disadvantage due to the adoption of the cemented lens has occurred. That is, the ideal performance required for an exposure of the selected pattern on a work by irradiating a projection light cannot be fully obtained due to the degradation of the focusing of the image resulting from the cemented lens. In other words, the ideal performance is not fully obtained due to the variation of aberration, which is the deviation from the ideal focus.

Therefore, the optical projection system to be adopted in the lithography apparatus that can control the magnification without causing the degradation of the focusing of the image and can control the occurrence of the distortion has been required. Additionally, the optical projection system to be adopted in the lithography apparatus that can control the magnification with accuracy, even if the light having low wavelength than ultraviolet ray is adopted as the illumination light, has been required.

SUMMARY OF THE INVENTION

The present invention relates to an optical projection system irradiating a projection light on a predetermined area of a work, the projection light is obtained by passing an illumination light from a light source through a mask.

This optical projection system includes a reflector provided with a first reflection surface and a second reflection surface which reflect the projection light and change a traveling direction of the projection light, an entrance lens through which the projection light is passed and guides the projection light to the first reflection surface, a reflective optics which reflects the projection light reflected by the first reflection surface and guides the projection light to the second reflection surface, an exit lens through which the projection light reflected by the second reflection surface is passed and guides the projection light to the work; and a position adjustor which supports coaxially the entrance lens and the exit lens so that the entrance lens is spaced a predetermined distance from the exit lens, and the reflector is positioned between the entrance lens and the exit lens, and the position adjustor slides the entrance lens and the exit lens in a direction along a light axis of the entrance lens and exit lens.

In this optical projection system, the reflective optics includes a concavo-reflection mirror which reflects the projection light reflected by the first reflection surface, and an optical compensation system possessing a group of lenses, and the optical compensation system, through which the projection light is passed, is positioned between the concavo-reflection mirror and the reflector, and corrects the chromatic aberrations of the projection light.

According to this optical projection system, the projection light from the entrance lens is reflected by the first reflection surface and the traveling direction thereof is changed from parallel direction to vertical direction. Then, the projection light reflected by the first reflection surface strikes the concavo-reflection mirror after passing through the optical compensation system, and is directed to the second reflection surface by the concavo-reflection mirror.

The project ion light whose traveling direction was changed by the concavo-reflection mirror strikes the second reflection surface. Thus, the traveling direction of the projection light is changed from vertical direction to parallel direction by the second reflection surface, and then passes through the exit lens.

In this optical projection system, the adjustment of magnification is performed by sliding the entrance lens and the exit lens in a direction along a light axis of the entrance lens and exit lens, while keeping the distance between the entrance lens and the exit lens, which are positioned at both sides of the reflector.

In this optical projection system, it is preferable that each lens of the optical compensation system is arranged so as to give a refraction index of positive value as a whole. This improves the focus of the image (pattern) that is finally formed on the mask.

In the optical projection system, it is preferable that a focal length of the concavo-reflection mirror, the entrance lens, and the exit lens are determined so as to meet a requirement defined by a following formula (1).

$$1.2 < |fa/fb| < 5.5 \qquad (1)$$

where fa denotes the focal length of the entrance lens and the exit lens, and fb denotes the focal length of the concavo-reflection mirror.

By keeping the absolute value to be computed from fa/fb between 1.2 and 5.5, the excess in focusing ability (optical power) of lenses that is caused when the absolute value of fa/fb is less than 1.2 and the deficiency in the focusing ability (optical power) of lenses that is caused when the absolute value of fa/fb is larger than 5.5 can be prevented. Thereby, telecentric condition, that is parallelism of light axis, can be maintained.

In the optical projection system, furthermore, a single lens is adopted as lenses used in the entrance lens, the exit lens, and each lens of optical compensation system. Thereby, the influence due to the variation of aberration, which is caused by the degradation of the focusing of the image, can be minimized under the condition that the light of ultraviolet ray or the light having shorter wavelengths than ultraviolet ray is adopted as the illumination light (projection light).

In the optical projection system, still furthermore, the position adjustor further includes a lens holder and a lens holder actuator.

The lens holder supports the entrance lens and the exit lens with a predetermined interval between the entrance lens and the exit lens. The lens holder actuator slides the lens holder in a direction along an optic axis of the entrance lens and the exit lens.

According to this construction, when adjusting the magnification of an image (pattern) to be focused, the lens holder actuator slides the lens holder in a direction along an optic axis. Thereby, the entrance lens and the exit lens are slid in the same direction while keeping the distance between the entrance lens and the exit lens.

In this occasion, when the entrance lens is slid so as to adjust the focus to the plus side, the exit lens is simultaneously slid so as to adjust the focus to the minus side. Thus, the effects on the focus due to the slide of these lenses are canceled each other. Thereby, the adjustment of magnification of the pattern is allowed without deviating focus.

DETAILED DESCRIPTION OF THE PREFERRED EMBODIMENT

The explanations about preferred embodiments of the present invention will be given with reference to the attached drawings.

Figure 1:
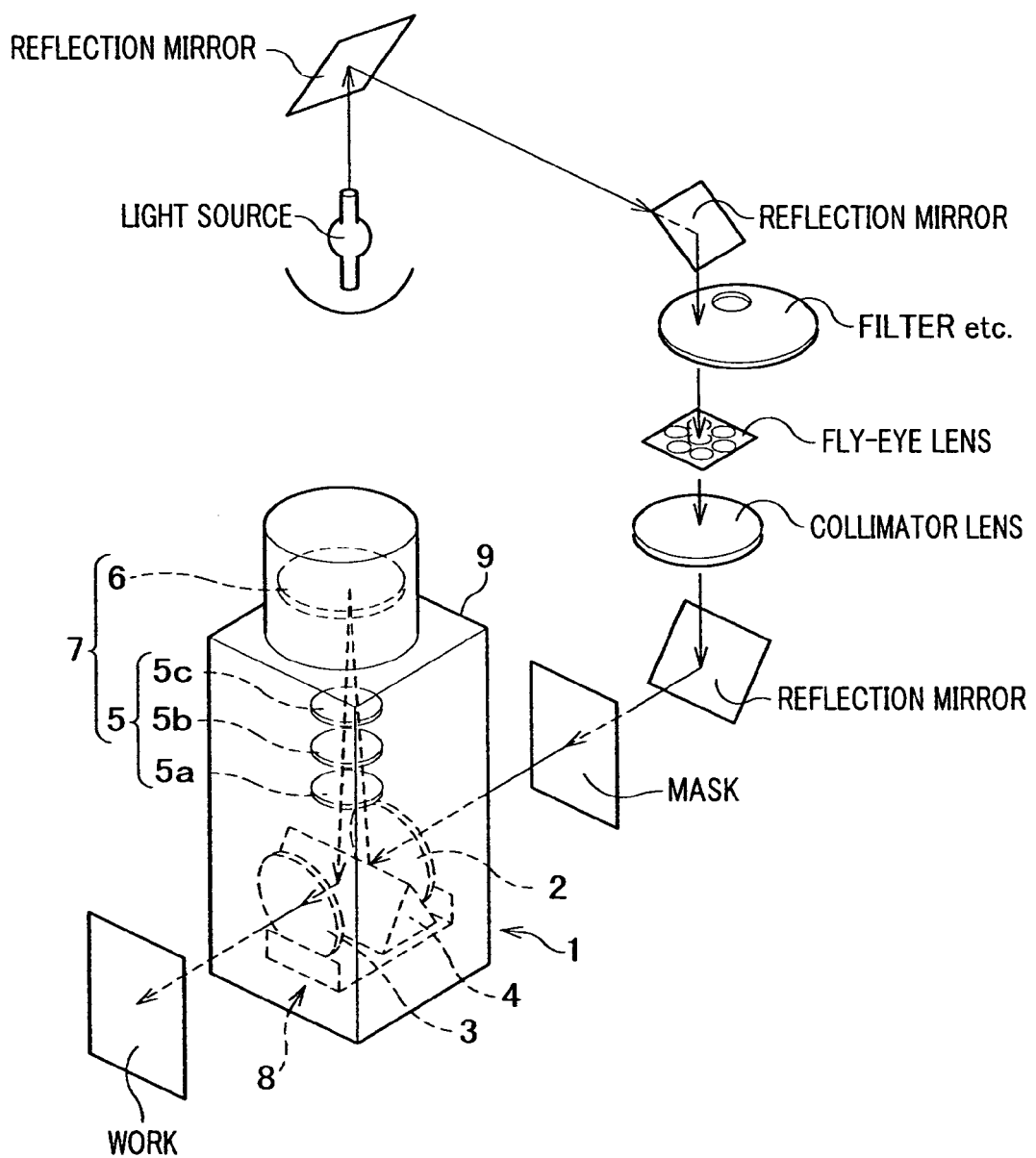
FIG. 1 is a perspective view showing the optical projection system according to the present invention.

FIG. 1 is a perspective view showing the optical projection system according to the present invention.

Figure 2:
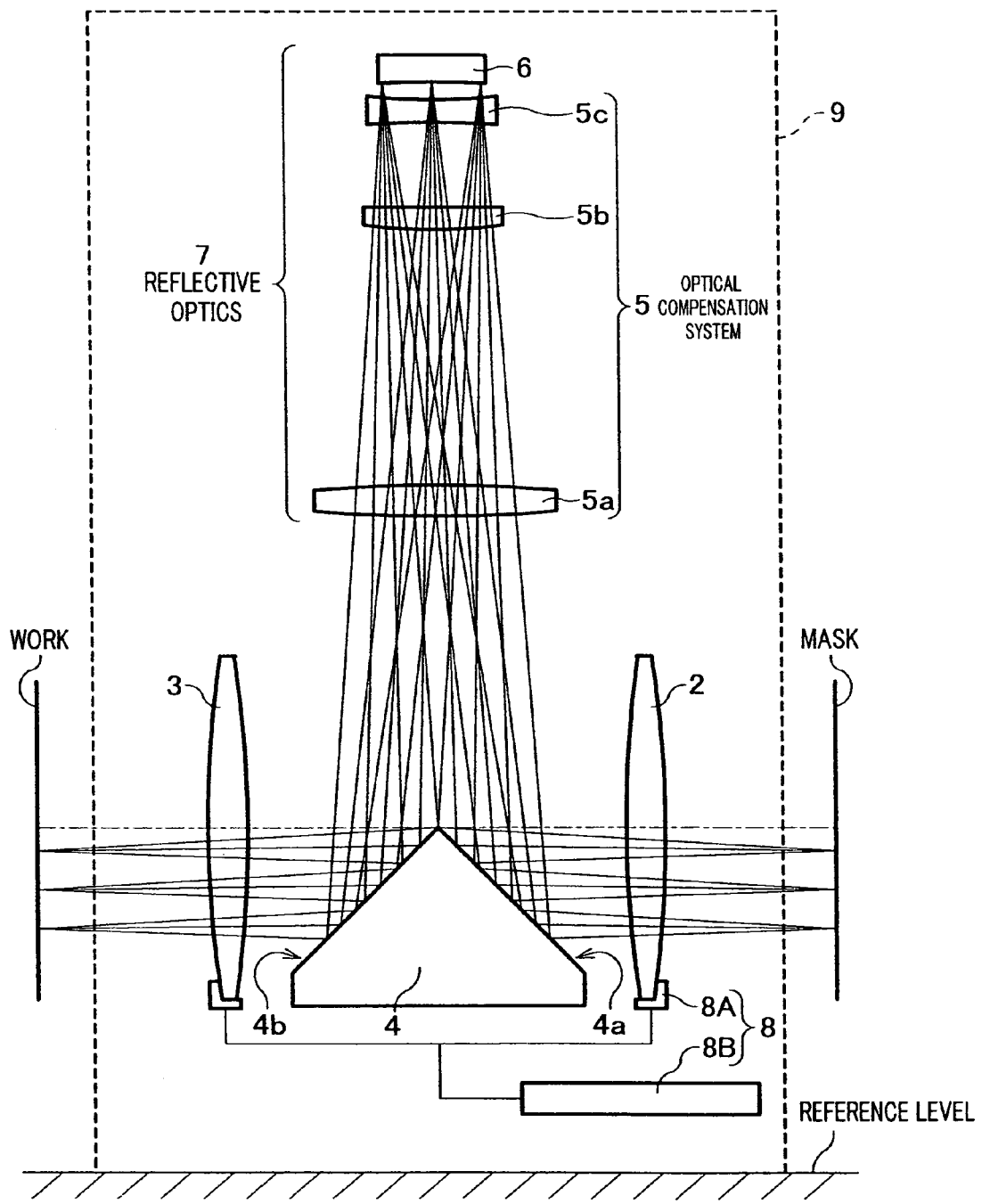
FIG. 2 is a cross-sectional view showing whole of the optical projection system according to the present invention.

FIG. 2 is a cross-sectional view showing whole of the optical projection system according to the present invention.

As shown in FIG. 1 and FIG. 2, an optical projection system 1 is positioned between a mask and a work of a lithography apparatus, and includes a convex lens 2, a convex lens 3, a reflector 4, a reflective optics 7, a position adjustor 8, and a housing 9. Hereinafter, in order to make a distinction between the convex lens 2 and the convex lens 3, the convex lens 2 is indicated by "entrance lens 2", and the convex lens 3 is indicated by "exit lens 3".

As shown in FIG. 2, the entrance lens 2 and the exit lens 3 are coaxially supported by the position adjustor 8. The entrance lens 2 is spaced a predetermined distance from the exit lens 3, and the reflector 4 is positioned between the entrance lens 2 and the exit lens 3.

When the projection light obtained by passing an illumination light through a mask is entered to the optical projection system 1, the projection light is reflected by a first reflection surface 4a of the reflector 4. Thereby, the traveling direction of the projection light is changed from the direction parallel to a reference level to the direction perpendicular to the reference level.

Then, the traveling direction of the projection light is reversed by the reflective optics 7 and is again guided to the reflector 4.

When the projection light strikes a second reflection surface 4b of the reflector 4, the traveling direction of the projection light is changed from the direction perpendicular to the reference level to the direction parallel to the reference level. Thus, the projection light is irradiated on the work after passing through the exit lens 3.

Here, each element of the optical projection system 1, that is, the entrance lens 2, the exit lens 3, the reflector 4, the reflective optics 7, and the position adjustor 8, is stored in the housing 9.

In the present embodiment, the reflective optics 7 comprises a group of lenses, each of which is disposed in the housing 9 so that each becomes parallel with respect to the reference level. The entrance lens 2 and the exit lens 3 supported by the position adjustor 8 are disposed in the housing 9 so that they become vertical with respect to the reference level.

In the present embodiment, the entrance lens 2 is spaced a substantial distance from the exit lens 3 so that the reflector 4 is positioned between the entrance lens 2 and the exit lens 3.

A single lens is adopted as lenses used in the optical projection system 1. This is because the focusing of an image is debased due to the influence of the cemented lens, when the cemented lens is used instead of the single lens under the condition that the light of ultraviolet ray or the light having shorter wavelengths than ultraviolet ray is adopted as the illumination light (projection light).

In the present embodiment, various kinds of lenses can be adopted as the entrance lens 2 and the exit lens 3 as long as they can fulfill the functions of conventional convex lenses.

Here, the term "functions of the conventional convex lenses" means that the function of concentrating the light of predetermined wavelength, such as ultraviolet ray, or the function of aligning in parallel the luminous flux of the light. Additionally, various kinds of materials can be selected for providing a lens as long as they have a sufficient abbe number and refractive index and they can support these functions.

In the present embodiment, the refractive index of the entrance lens 2 is the same as that of the exit lens 3.

Referring to FIG. 2, the reflector 4 changes a traveling direction of the light (projection light).

To be more specific, in case of the projection light came from the entrance lens 2, the reflector 4 changes the traveling direction of the projection light from the direction parallel to the reference level to the direction perpendicular to the reference level.

On the contrary, in case of the projection light came from the reflective optics 7, the reflector 4 changes the traveling direction of the projection light from the direction perpendicular to the reference level to the direction parallel to the reference level, and guides the projection light to the exit lens 3.

The reflector 4 is provided with a first reflection surface 4a and a second reflection surface 4b, each of which has a predetermined crossing angle to the reference level.

Therefore, the traveling direction of the projection light to be entered from the entrance lens 2 and the projection light to be entered from the reflective optics 7 is changed by the first reflection surface 4a and the second reflection surface 4b, respectively.

The reflector 4 has a shape of pentagonal prism, which is, for example, obtained by uniting an isosceles triangular prism with a rectangular parallelepiped. In this reflector 4, slopes of isosceles parts of the isosceles triangular prism correspond to the first reflection surface 4a and the second reflection surface 4b, respectively.

To be more precise, the reflector 4 has a shape of right angle prism possessing the pentagonal shape in sectional viewing (see FIG. 2). In the present embodiment, the shape of the reflector 4 is not limited to these, for example, the shape of triangular prism or pentagonal prism may be adoptable as the shape of the reflector 4.

The surface of the first reflection surface 4a and the second reflection surface 4b can be provided utilizing various techniques as long as the projection light is reflected and directed to the desired direction. For example, the reflection surface provided with the reflection coating formed by utilizing the method, such as sputtering or deposition technique, or the reflection surface provided with the mirror finished surface formed by utilizing the mirror grinding technique are adopted as the surface of the present embodiment.

In the present embodiment, additionally, the first reflection surface 4a and the second reflection surface 4b are established on the reflector 4 so that the first reflection surface 4a and the second reflection surface 4b have a 45-degree crossing angle to the light pass. Here, the light path means the path of the projection light in such a case that the projection light from the entrance lens 2 directly strikes the exit lens 3.

Therefore, if the light path is parallel to the reference level, the first reflection surface 4a and the second reflection surface 4b have a 45-degree crossing angle to the reference level.

Thus, in the present embodiment, the incident angle to the first reflection surface 4a of the projection light from the entrance lens 2 is 45-degree, and the incident angle to the second reflection surface 4b of the projection light from the reflective optics 7 is 45-degree.

The crossing angle with respect to the light path (reference level) of the first reflection surface 4a and the second reflection surface 4b is not limited at 45-degree. This crossing angle may be changed as long as the projection light accurately strikes the work and the exposure of the selected pattern on the work is accurately achieved.

Referring to FIG. 2, the position and placement in the housing 9 of the reflector 4 is not limited to this, any position and placement can be chosen as long as the following requirements are satisfied.

That is, 1) the relationships between the first reflection surface 4a and the entrance lens 2 and the relationships between the second reflection surface 4b and the exit lens 3 that have been explained in above are satisfied, irrespective of the position and placement of the reflector 4, and 2) the entrance lens 2 and the exit lens 3 can be slid, by the position adjustor 8, along and parallel to the light axis of each lens, irrespective of the position and placement of the reflector 4.

For example, the reflector 4 may be disposed within the housing 9 using a table (not shown) or a support material. Here, when using the table, the reflector 4 is placed on the table. On the contrary, when using the support material, the reflector 4 is supported at both sides thereof by the support material.

As shown in FIG. 2, the reflective optics 7 includes an optical compensation system 5 and a concavo-reflection mirror 6.

The optical compensation system 5 corrects the chromatic aberrations of the projection light whose direction was changed by the reflector 4. The concavo-reflection mirror 6 reflects in reverse direction the projection light passed through the optical compensation system 5.

To be more specific, the concavo-reflection mirror 6 reflects the projection light, which was reflected by the first reflection surface 4a of the reflector 4 and was passed through the optical compensation system 5, and guides the projection light toward the second reflection surface 4b of the reflector 4 through the optical compensation system 5.

The focal length of the concavo-reflection mirror 6 and the height position in the housing 9 thereof are determined depending on the arrangement of the entrance lens 2, reflector 4, and the optical compensation system 5.

In the present embodiment, the focal length of the concavo-reflection mirror 6, the entrance lens 2, and the exit lens 3 are determined so as to meet a requirement defined by the following formula (1).

$$1.2 < |fa/fb| < 5.5 \quad (1)$$

where fa denotes the focal length of the entrance lens 2 and the exit lens 3, and fb denotes the focal length of the concavo-reflection mirror 6.

According to this formula (1), it is clarified that an absolute value of fa/fb is between 1.2 and 5.5.

Here, if the requirement of this formula (1) is not satisfied, for example, the absolute value computed from fa/fb is less than 1.2 (1.2>|fa/fb)|), each focusing ability (optical power) of the entrance lens 2 and exit lens 3 becomes higher than that of the concavo-reflection mirror 6. Thereby, telecentric condition can not be maintained.

This is because the telecentric condition, that is parallelism of light axis, becomes worse as the focal length fa becomes shorter.

If the absolute value computed from fa/fb is larger than 5.5 (5.5<|fa/fb)|), on the contrary, each focusing ability (optical power) of the entrance lens 2 and exit lens 3 becomes smaller than that of the concavo-reflection mirror 6. Thereby, telecentric condition can not be maintained. This is because the telecentric condition, that is parallelism of light axis, becomes worse as the focal length fa becomes longer.

Here, the difference depending on whether or not the requirement of this formula (1) is satisfied will be explained using FIG. 3A and FIG. 3B indicating the MTF (Modulation Transfer Function) curve.

Here, MTF curve is a graph to be used for detecting a focusing performance of lens. In this MTF cureve, how accurately the lens can reproduce a mask pattern (image) with good contrast is indicated in compliance with the spatial frequency.

Figure 3A:
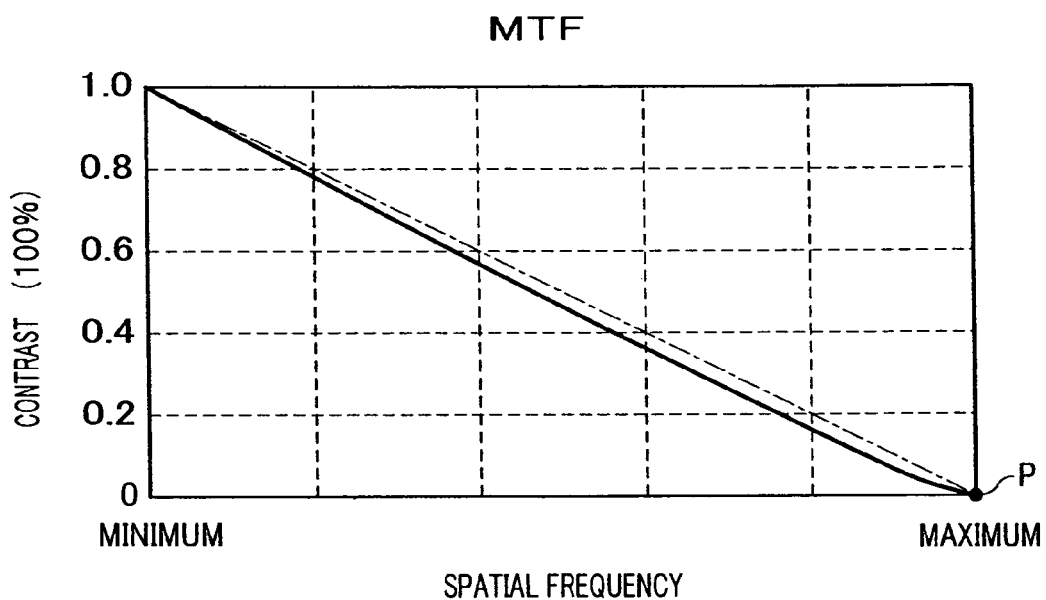
FIG. 3A is a graph showing the MTF curve, which indicates how accurately the lens can reproduce a mask pattern (image) with good contrast in compliance with the spatial frequency in the condition where the requirement of formula (1) is satisfied.

FIG. 3A shows MTF curve for the condition where the requirement of formula (1) is satisfied. FIG. 3B shows MTF curve for the condition where the requirement of formula (1) is not satisfied.

Figure 3B:
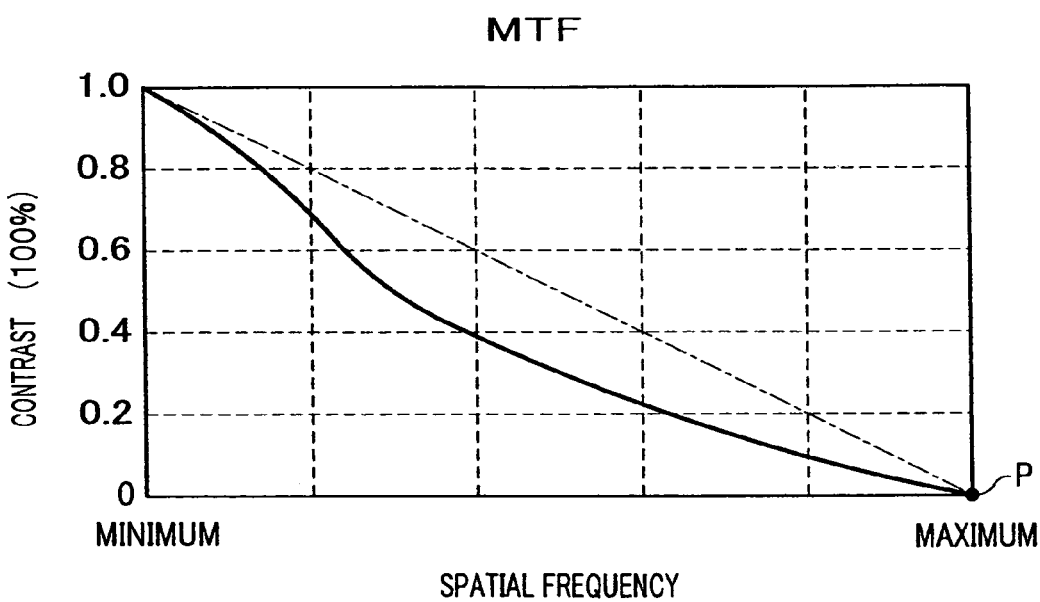
FIG. 3B is a graph showing the MTF curve, which indicates how accurately the lens can reproduce a mask pattern (image) with good contrast in compliance with the spatial frequency in the condition where the requirement of formula (1) is not satisfied.

Referring to FIG. 3A and FIG. 3B, the dashed line connecting the point whose contrast is 1.0 (100%) and the point P whose frequency is maximum is a ideal line, by which focusing performance of an ideal lens is denoted. In these figures, the point P is cut-off frequency (resolution), which is defined by the following formula:

Cut-off frequency=$\lambda/2 \times NA$ where, $\lambda$ is wavelength, NA(NA=n×sin $\alpha$) is an numerical aperture of lens.

Here, if it is assumed that the focal length fa of the entrance lens 2 and the exit lens 3 is 800 (fa=800) and the focal length fb of the concavo-reflection mirror 6 is 670 (fb=670), the value of fa/fb computed from formula (1) is 1.19. That is, the requirement defined by formula (1) is not satisfied in this assumption. The MTF curve under this assumption is shown in FIG. 3B. As can be seen from FIG. 3B, the MTF curve of this case, shown by real line, is far from the ideal line shown by dashed line.

This is because, since the requirement of formula (1) is not satisfied, telecentric condition becomes worse due to the above described reasons. This makes larger the disagreement between the ideal line and the MFT curve (the real line of FIG. 3B).

On the contrary, if it is assumed that the focal length fa of the entrance lens 2 and the exit lens 3 is 1200 (fa=1200) and the focal length fb of the concavo-reflection mirror 6 is 670 (fb=670), the value of fa/fb computed from formula (1) is 1.79. That is, the requirement defined by formula (1) is satisfied in this assumption. The MTF curve under this assumption is shown in FIG. 3A. As can be seen from FIG. 3A, the MTF curve of this case, shown by real line, is near the ideal line shown by dashed line.

This is because, since the requirement of formula (1) is satisfied, telecentric condition is improved due to the above described reasons. This makes smaller the disagreement between the ideal line and the MTF curve (the real line of FIG. 3A)

If the value of fa/fb computed from formula (1), additionally, exceeds 5.5, the requirement defined by formula (1) is not satisfied, and the result similar to the case of FIG. 3B is obtained. That is, the disagreement between the ideal line and the real line (MTF curve) becomes large.

In the present embodiment, as described above, the projection light that can focus the selected pattern with high contrast and telecentricity is projected on the work, as long as the requirement defined by formula (1) is satisfied in the relationship between the entrance lens 2, the exit lens 3, and the concavo-reflection mirror 6.

Referring to FIG. 2, the optical compensation system 5 includes a first convex lens 5a, a second convex lens 5b, and a concave lens 5c. These lenses are coaxially disposed, and a single lens is adopted as these lenses.

Here, any type of lenses can be adopted as the first convex lens 5a and the second convex lens 5b, as long as a convex surface is formed on at least one side surface thereof, and any type of lenses can be adopted as the concave lens 5c, as long as a concave surface is formed on at least one side surface thereof.

In the present embodiment, the optical compensation system 5 includes the first convex lens 5a and the second convex lens 5b. But, one of these lenses may be omitted, if keeping the accuracy in high level of the optical compensation system 5 is not required.

In this case, it is preferable that the optical compensation system 5 includes the concave lens 5c and one of the first convex lens 5a and the second convex lens 5b.

Referring to FIG. 2, the reflective optics 7 includes the concavo-reflection mirror 6, the first convex lens 5a, the second convex lens 5b, and the concave lens 5c.

The concavo-reflection mirror 6 is stored in the housing 9 so that the concavo-reflection mirror 6 is positioned just above the reflector 4 and is spaced a predetermined distance from the reference level.

The first convex lens 5a having a convex surface on both sides thereof and the second convex lens 5b having a convex surface on one side thereof are positioned between the concavo-reflection mirror 6 and the reflector 4. The first convex lens 5a is spaced a substantial distance from the second convex lens 5b. The concave lens 5c having a concave surface on both sides thereof is positioned between the first convex lens 5a and the concavo-reflection mirror 6. Here, as can be seen from FIG. 3, the concave lens 5c is positioned in the vicinity of the concavo-reflection mirror 6.

In the present embodiment, each lens of the reflective optics 7 is arranged so as to give a refraction index of positive value as a whole. Additionally, each lens, i.e. the first convex lens 5a, the second convex lens 5b, and the concavo lens 5c, of this reflective optics 7 is disposed using a lens holder (hot shown) at a predetermined position within the housing 9

Figure 4A:
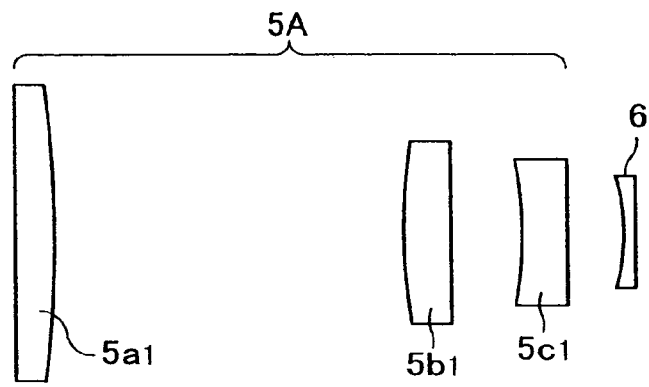
FIG. 4A through 4C are the schematic view showing the modification of the arrangement of optical compensation system in the optical projection system.
Figure 4B:
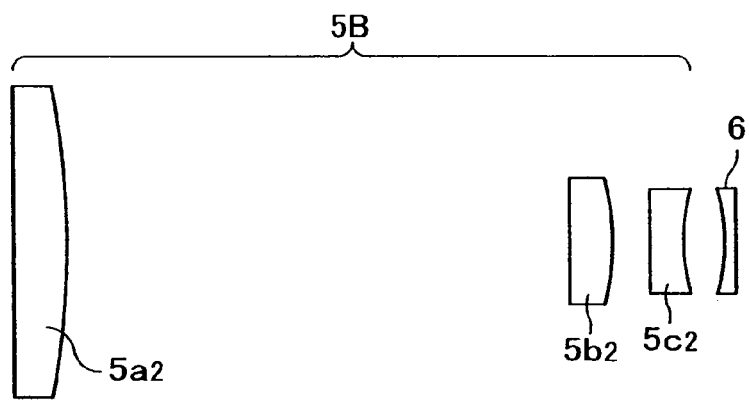
Figure 4C:
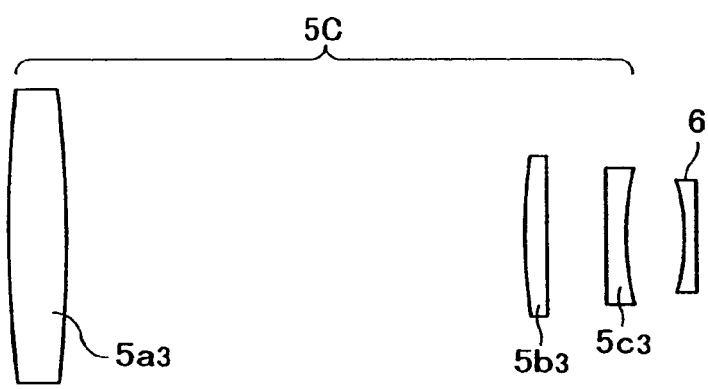

The types and positions of the lenses disposed within the optical compensation system 5 of the reflective optics 7 is not limited to these, for example, the types and positions of lenses shown in FIG. 4A through FIG. 4c can be adoptable.

In case of FIG. 4A, optical compensation system 5A includes a convex lens 5a1, a convex lens 5b1, and a concave lens 5c1.

A lens having a convex surface at one side thereof is adopted as the convex lens 5a1 and the convex lens 5b1, and these lenses are disposed so that respective convex surfaces face each other. A lens having a concave surface at one side thereof is adopted as the concave lens 5c1, and the concave lens 5c1 is disposed so that the concave surface faces the convex lens 5b1. Here, each lens of the optical compensation system 5A is arranged so as to give a refraction index of positive value as a whole.

In case of FIG. 4B, optical compensation system 5B includes a convex lens 5a2, a convex lens 5b2, and a concave lens 5c2.

A lens having a convex surface at one side thereof is adopted as the convex lens 5a2 and the convex lens 5b2, and a lens having a concave surface at one side thereof is adopted as the concave lens 5c2.

These lenses are disposed so that respective convex surfaces of the convex lens 5a2 and the convex lens 5b2 and the concave surface of the concave lens 5c2 face the concavo-reflection mirror 6, and so that each lens of the optical compensation system 5B is arranged so as to give a refraction index of positive value as a whole.

In case of FIG. 4C, optical compensation system 5C includes a convex lens 5a3, a convex lens 5b3, and a concave lens 5c3. This optical compensation system 5C is different from the lenses shown in FIG. 4A in terms of the location of the concave lens 5c3 and the types of the convex lens 5a3. That is, in this optical compensation system 5c, the concave surface of the concave lens 5c3 faces the concavo-reflection mirror 6, a lens having a convex surface at both sides thereof is adopted as the convex lens 5a3. Here, each lens of the optical compensation system 5C is arranged so as to give a refraction index of positive value as a whole.

The constructions of the optical compensation system 5 of the present invention are not limited to these embodiments disclosed in FIG. 4A through FIG. 4C. Any modification and changes may be acceptable as long as each lens of the optical compensation system 5 gives a refraction index of positive value as a whole. Therefore, the diameter and thickness of each convex lens and concave lens may be modified as appropriate.

As shown in FIG. 2 and FIGS. 5A to 5C, the position adjustor 8 includes a lens holder 8A and a lens holder actuator 8B. The lens holder 8A supports the entrance lens 2 and the exit lens 3 with a predetermined interval between the entrance lens 2 and the exit lens 3. The lens holder actuator 8B slides the lens holder 8A.

In this position adjustor 8, the lens holder 8A is allowed to slide along a direction of light axis A while keeping in parallel the entrance lens 2 and the exit lens 3 each other. Here, the direction of light axis A (hereinafter indicated as "axis direction A") means the path of the projection light in such a case that the projection light from the entrance lens 2 directly strikes the exit lens 3.

The lens holder actuator 8B slides the lens holder 8A along an axis direction A, and a drive motor, such as servo motor, or the torque transmitter, such as a feed screw mechanism, are adopted as this lens holder actuator 8B. The lens holder actuator 8B adopted in this embodiment is not limited to these elements. Various kinds of mechanism can be adoptable as long as it can slide the lens holder 8A accurately.

In the present embodiment, the adjustment of the magnification of the image (pattern) to be focused on the work is achieved by sliding the lens holder 8A along the axis direction A using the lens holder actuator 8B of the position adjustor 8.

To be more specific, by the position adjustor 8, the positional relationship between the reflector 4 and the entrance lens 2 and the positional relationship between the reflector 4 and the exit lens 3 are changed. This is because the lens holder 8A slides along the guide rail (not shown) while keeping in constant the distance between the entrance lens 2 and the exit lens 3.

Therefore, when the entrance lens 2 is slid so as to adjust the focus to the plus side, the exit lens 3 is simultaneously slid so as to adjust the focus to the minus side. Thus, the effects on the focus due to the slide of these lenses are canceled each other.

In this occasion, since the distance between the mask and the entrance lens 2 and the distance between the work and the exit lens 3 are changed in compliance with the slide of the entrance lens 2 and the exit lens 3, the magnification of an image (pattern) to be focused on the work can be adjustable. Thereby, the adjustment of magnification of the pattern is allowed without deviating focus.

Next, the explanation of the function of the optical projection system 1 will be given.

Referring to FIG. 1, the illumination light irradiated from the light source is reflected by reflection mirrors and is directed to the optical projection system 1 through the filter and various lenses (fly-eye lens, collimator lens, etc.). The illumination light passed through the entrance lens 2 is then irradiated on the reflector 4 as the projection light.

Referring to FIG. 2, the projection light entered from the entrance lens 2 is reflected by the first reflection surface 4a of the reflector 4 and the direction of the light path of the projection light is changed to the perpendicular direction from the horizontal direction with respect to the reference level. Then, the projection light is guided to the reflective optics 7.

In the present embodiment, additionally, the light path of the projection light is established so that the projection light is irradiated to the lower half of the entrance lens 2.

The projection light reflected by the first reflection surface 4a of the reflector 4 strikes the concavo-reflection mirror 6 through the optical compensation system 5, then the projection light is reflected by the concavo-reflection mirror 6 and is directed to the reverse direction. Thereby, the projection light is irradiated on the second reflection surface 4b of the reflector 4.

In the present embodiment, the optical compensation system 5 is arranged so as to give a refraction index of positive value as a whole, and the focal length fb of the concavo-reflection mirror 6, and the focal length fa of the entrance lens 2 and exit lens 3 are determined so that the requirement defined by formula (1) is satisfied.

Thereby, telecentric condition, that is parallelism of light axis, can sufficiently be maintained.

The projection light irradiated on the reflector 4 from the reflective optics 7 is reflected by the second reflection surface 4b and the traveling direction thereof is changed from the direction perpendicular to the reference level to the direction horizontal to the reference level. Then, the projection light is irradiated on the work via the exit lens 3.

In the present embodiment, the light path of the projection light entered to the exit lens 3 after reflected by the second reflection surface 4b is established so that the projection light is irradiated to the lower half of the exit lens 3.

Next, the motion of the position adjustor 8 while controlling the magnification of an image (pattern) to be focused on the work will be explained.

Figure 5A:
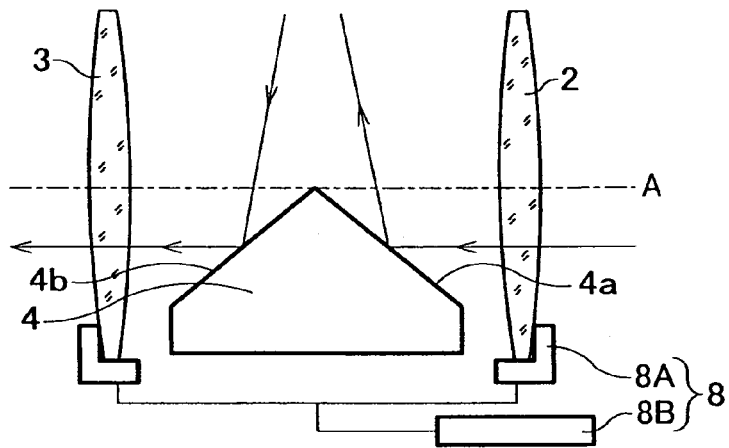
FIG. 5A through 5C are the schematic view explaining the slide of the entrance lens and the exit lens of the optical projection system.

Referring to FIG. 5A, when each magnification of the entrance lens 2 and the exit lens 3 is 1:1, the lens holder actuator 8B of the position adjustor 8 adjusts the position of the lens holder 8A so that the distance between the entrance lens 2 and the first reflection surface 4a becomes the same as the distance between the exit lens 3 and the second reflection surface 4b.

In the present embodiment, a variation of a magnification of the entrance lens 2 and exit lens 3 is associated with a shift amount of the lens holder 8A, and the association of these factors is held on the recording device (not shown).

Therefore, if the magnification of the entrance lens 2 and the exit lens 3 is redefined, the position adjustor 8 determines the shift amount and direction of the lens holder 8A based on this association.

Figure 5B:
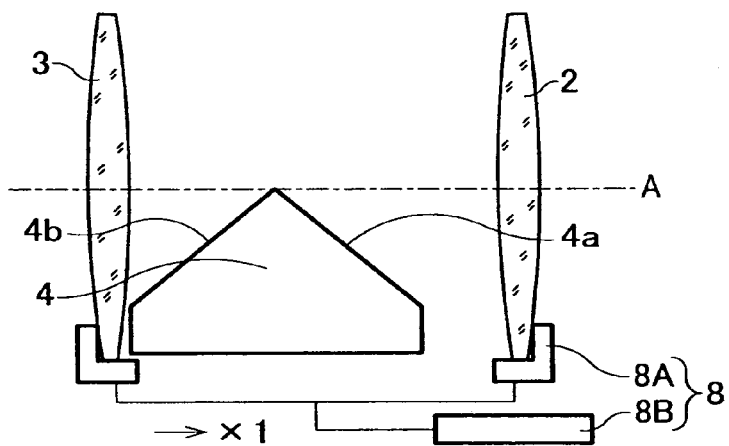

Referring to FIG. 5B, when decreasing the magnification of the entrance lens 2 and the exit lens 3, the lens holder actuator 8B of the position adjustor 8 slides the lens holder 8A in the direction denoted by X1 in figure and makes larger the distance between the entrance lens 2 and the first reflection surface 4a than the distance between the exit lens 3 and the second reflection surface 4b.

In this occasion, the entrance lens 2 and the exit lens 3 are slid in compliance with the slide of the lens holder 8A while keeping the distance between the entrance lens 2 and the exit lens 3. Thereby, the magnification of the image (pattern) to be focused on the work can be smaller without causing the degradation of the focus.

Figure 5C:
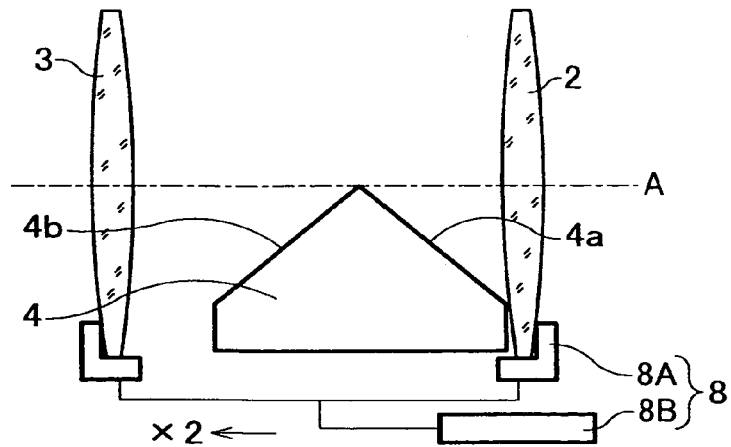
Figure 6:
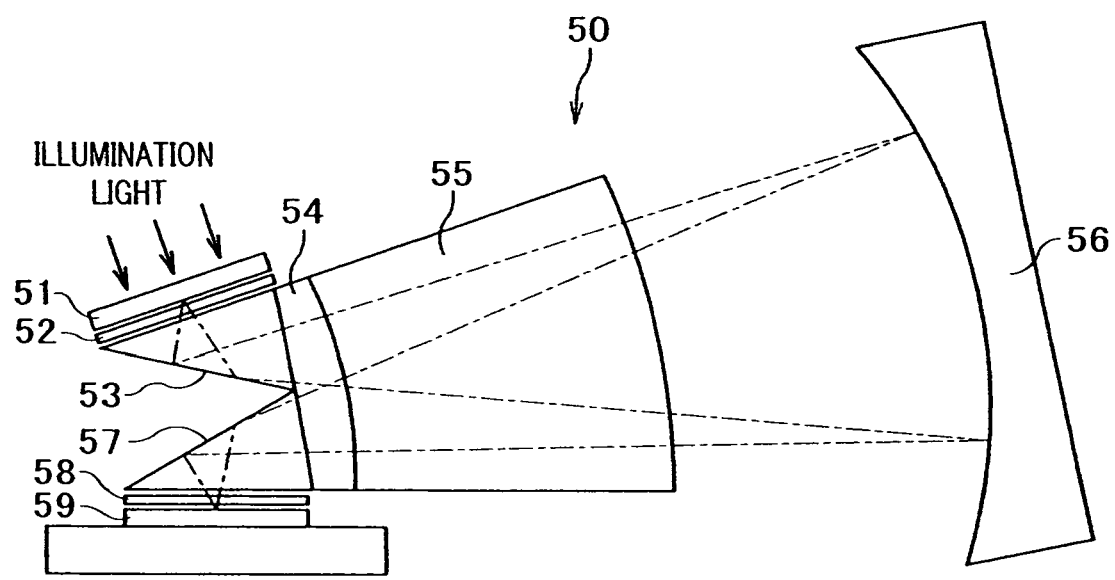
FIG. 6 is a side view showing the conventional optical projection system.
Figure 7A:
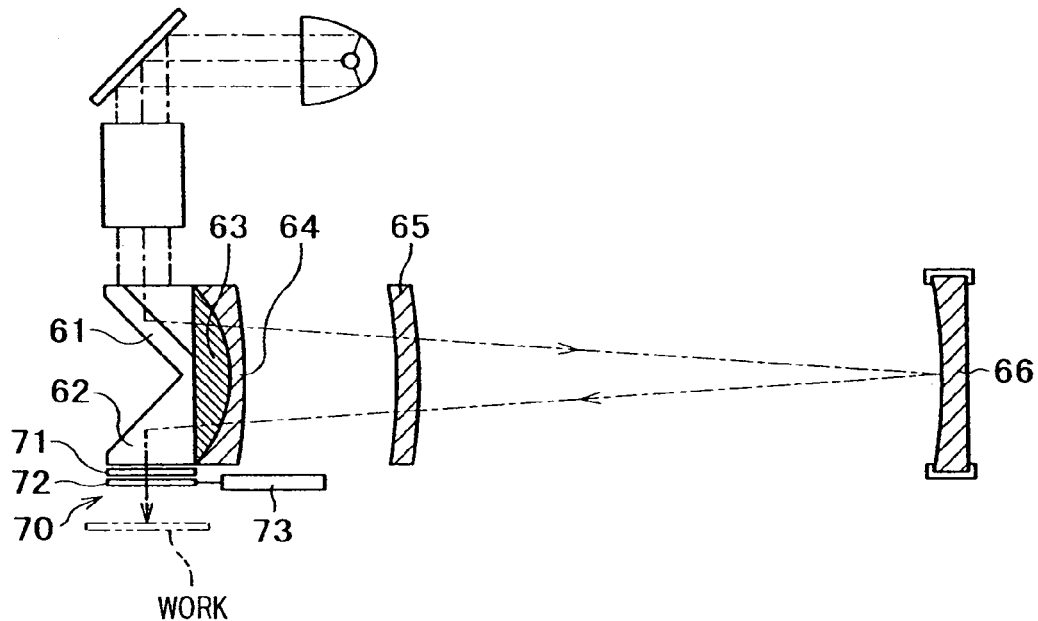
FIG. 7A is a sectional view showing the conventional optical projection system.
Figure 7B:
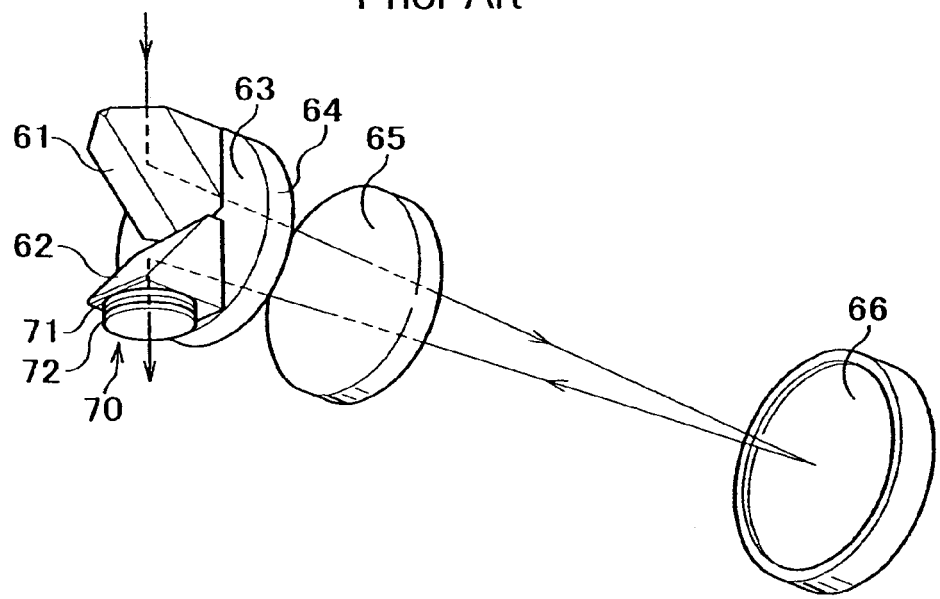
FIG. 7B is a perspective view showing the conventional optical projection system.

On the contrary, referring to FIG. 5C, when increasing the magnification of the entrance lens 2 and the exit lens 3, the lens holder actuator 8B of the position adjustor 8 slides the lens holder 8A in the direction denoted by X2 in figure and makes smaller the distance between the entrance lens 2 and the first reflection surface 4a than the distance between the exit lens 3 and the second reflection surface 4b.

In this occasion, the entrance lens 2 and the exit lens 3 are slid together with the slide of the lens holder 8A while keeping the distance between the entrance lens 2 and the exit lens 3. Thereby, the magnification of the image (pattern) to be focused on the work can be larger without spoiling the focus.

From the explanations described above, benefits to be obtained from the optical projection system according to the present embodiment are as follows.

In the optical projection system, the entrance lens and the exit lens, which are placed on both sides of the reflector, are supported by the position adjustor so that the entrance lens and the exit lens are slid in a direction along the light axis, while keeping the distance between the entrance lens and the exit lens. Thus, the adjustment of the magnification of the image (pattern) to be focused on the work is achieved by sliding the entrance lens and the exit lens without deviating focus.

Therefore, the optical projection system according to the present invention allows controlling the magnification while keeping an optical balance, and allows minimizing the occurrence of the distortion.

In the optical projection system, furthermore, each lens of the reflective optics is arranged so as to give a refraction index of positive value as a whole, and this improves the focus of the pattern to be formed on the work.

In the optical projection system, still furthermore, the focal length of the concavo-reflection mirror, the entrance lens, and the exit lens are determined so as to meet a requirement defined by the following formula (1).

$$1.2 < |fa/fb| < 5.5 \qquad (1)$$

where fa denotes the focal length of the entrance lens and the exit lens, and fb denotes the focal length of the concavo-reflection mirror.

Thus, the projection of the pattern formed on the mask can be achieved while keeping the telecentric condition, which is parallelism of light axis.

In the optical projection system, furthermore, a single lens is adopted as lenses provided on the light path of the entrance lens and the exit lens. Therefore, the projection of projection light with high accuracy can be achieved. This is because the consideration of the influence due to the cemented lens is not required.

In the optical projection system, finally, the lens holder which supports the entrance lens and exit lens with a predetermined interval is slid in parallel with respect to the reference level by the lens holder actuator. This allows simplifying the construction of the optical projection system and allows the smooth side of each lens with high positional accuracy.

What is claimed is:

1. An optical projection system irradiating an projection light on a predetermined area of a work, the projection light is obtained by passing an illumination light from a light source through a mask, the optical projection system comprising:
 a reflector provided with a first reflection surface and a second reflection surface which reflect the projection light and change a traveling direction of the projection light;
 an entrance lens through which the projection light is passed and guides the projection light to the first reflection surface;

a reflective optics which reflects the projection light reflected by the first reflection surface and guides the projection light to the second reflection surface;

an exit lens through which the projection light reflected by the second reflection surface is passed and guides the projection light to the work; and a position adjustor which supports coaxially the entrance lens and the exit lens so that the entrance lens is spaced a predetermined distance from the exit lens, and the reflector is positioned between the entrance lens and the exit lens, and the position adjustor slides the entrance lens and the exit lens in a direction along a light axis of the entrance lens and exit lens, wherein the reflective optics includes a concavo-reflection mirror which reflects the projection light reflected by the first reflection surface (4a) and an optical compensation system possessing a group of lenses, wherein the optical compensation system, through which the projection light is passed, is positioned between the concavo-reflection mirror and the reflector, and corrects the chromatic aberrations of the projection light.

2. An optical projection system according to claim 1, wherein each lens of the reflective optics is arranged so as to give a refraction index of positive value as a whole.

3. An optical projection system according to claim 1, wherein a focal length of the concavo-reflection mirror, the entrance lens, and the exit lens are determined so as to meet a requirement defined by a following formula (1)

$$1.2 < |fa/fb| < 5.5 \qquad (1)$$

where fa denotes the focal length of the entrance lens and the exit lens, and fb denotes the focal length of the concavo-reflection mirror.

4. An optical projection system according to claim 2, wherein a focal length of the concavo-reflection mirror, the entrance lens, and the exit lens are determined so as to meet a requirement defined by a following formula (1)

$$1.2 < |fa/fb| < 5.5 \qquad (1)$$

where fa denotes the focal length of the entrance lens and the exit lens, and fb denotes the focal length of the concavo-reflection mirror.

5. An optical projection system according to claim 1, wherein a single lens is adopted as lenses used in the entrance lens, the exit lens, and each lens of the reflective optics.

6. An optical projection system according to claim 2, wherein a single lens is adopted as lenses used in the entrance lens, the exit lens, and each lens of the reflective optics.

7. An optical projection system according to claim 3, wherein a single lens is adopted as lenses used in the entrance lens, the exit lens, and each lens of the reflective optics.

8. An optical projection system according to claim 4, wherein a single lens is adopted as lenses used in the entrance lens, the exit lens, and each lens of the reflective optics.

9. An optical projection system according to claim 1, wherein the position adjustor further comprising:

a lens holder supporting the entrance lens and the exit lens with a predetermined interval between the entrance lens and the exit lens; and a lens holder actuator sliding the lens holder in a direction along an optic axis of the entrance lens and the exit lens.

10. An optical projection system according to claim 2, wherein the position adjustor further comprising:

a lens holder supporting the entrance lens and the exit lens with a predetermined interval between the entrance lens and the exit lens; and a lens holder actuator sliding the lens holder in a direction along an optic axis of the entrance lens and the exit lens.

11. An optical projection system according to claim 3, wherein the position adjustor further comprising:

a lens holder supporting the entrance lens and the exit lens with a predetermined interval between the entrance lens and the exit lens; and a lens holder actuator sliding the lens holder in a direction along an optic axis of the entrance lens and the exit lens.

12. An optical projection system according to claim 4, wherein the position adjustor further comprising:

a lens holder supporting the entrance lens and the exit lens with a predetermined interval between the entrance lens and the exit lens; and a lens holder actuator sliding the lens holder in a direction along an optic axis of the entrance lens and the exit lens.

13. An optical projection system according to claim 5, wherein the position adjustor further comprising:

a lens holder supporting the entrance lens and the exit lens with a predetermined interval between the entrance lens and the exit lens; and a lens holder actuator sliding the lens holder in a direction along an optic axis of the entrance lens and the exit lens.

14. An optical projection system according to claim 6, wherein the position adjustor further comprising:

a lens holder supporting the entrance lens and the exit lens with a predetermined interval between the entrance lens and the exit lens; and a lens holder actuator sliding the lens holder in a direction along an optic axis of the entrance lens and the exit lens.

15. An optical projection system according to claim 7, wherein the position adjustor further comprising:

a lens holder supporting the entrance lens and the exit lens with a predetermined interval between the entrance lens and the exit lens; and a lens holder actuator sliding the lens holder in a direction along an optic axis of the entrance lens and the exit lens.

16. An optical projection system according to claim 8, wherein the position adjustor further comprising:

a lens holder supporting the entrance lens and the exit lens with a predetermined interval between the entrance lens and the exit lens; and a lens holder actuator sliding the lens holder in a direction along an optic axis of the entrance lens and the exit lens.

* * * * *